United States Patent [19]

Higurashi

[11] Patent Number: 4,562,492
[45] Date of Patent: Dec. 31, 1985

[54] NOISE REDUCTION CIRCUIT
[75] Inventor: Seiji Higurashi, Chiba, Japan
[73] Assignee: Victor Company of Japan, Limited, Yokohama, Japan
[21] Appl. No.: 627,384
[22] Filed: Jul. 3, 1984
[30] Foreign Application Priority Data Jul. 4, 1983 [JP] Japan .......................... 58-103624[U]

[51] Int. Cl.$^4$ ........................... G11B 5/45; G11B 5/62
[52] U.S. Cl. ......................................... 360/65; 360/68
[58] Field of Search ............................. 360/65, 67, 68; 369/174, 175, 134

[56] References Cited

U.S. PATENT DOCUMENTS 4,340,950  7/1982  Kosaka ................................ 360/65
4,369,509  1/1983  Akagiri ................................ 360/68

Primary Examiner—Vincent P. Canney
Attorney, Agent, or Firm—Jordan and Hamburg

[57] ABSTRACT

A noise reduction circuit for use with an audio signal system of a magnetic recording and playback apparatus which is equipped with an encoder for recording an audio signal on a recording medium with a desirable S/N ratio and a decoder for desirably restoring a high frequency component of a recorded signal and reproducing an audio signal with little noise. A low pass filter is provided after a voltage control amplifier so as to attenuate a noise component in a high frequency range which is attributable to the voltage control amplifier itself. A high pass filter has a filtering characteristic which makes the signal level in a high frequency range higher, compared to conventional one, thereby lowering the level of an output of the encoder in a high frequency range.

5 Claims, 9 Drawing Figures

F I G. 3A
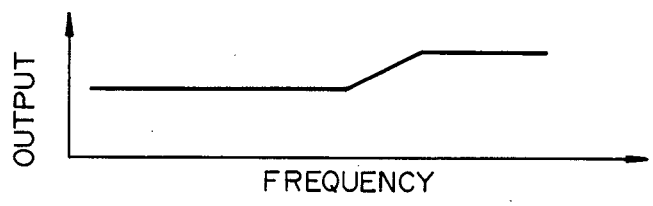
F I G. 3B
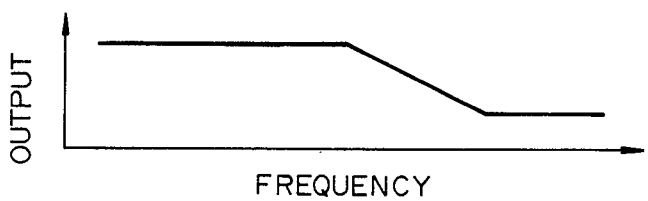
F I G. 3C
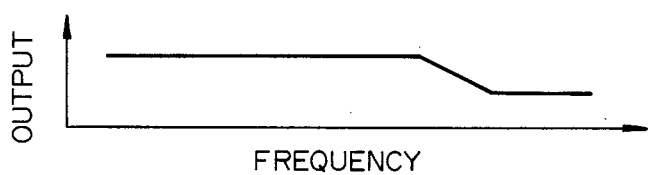
F I G. 3D
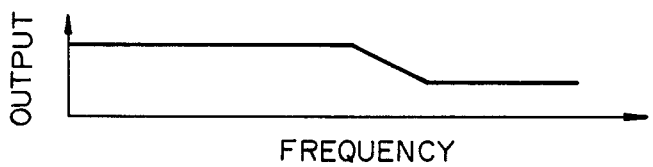

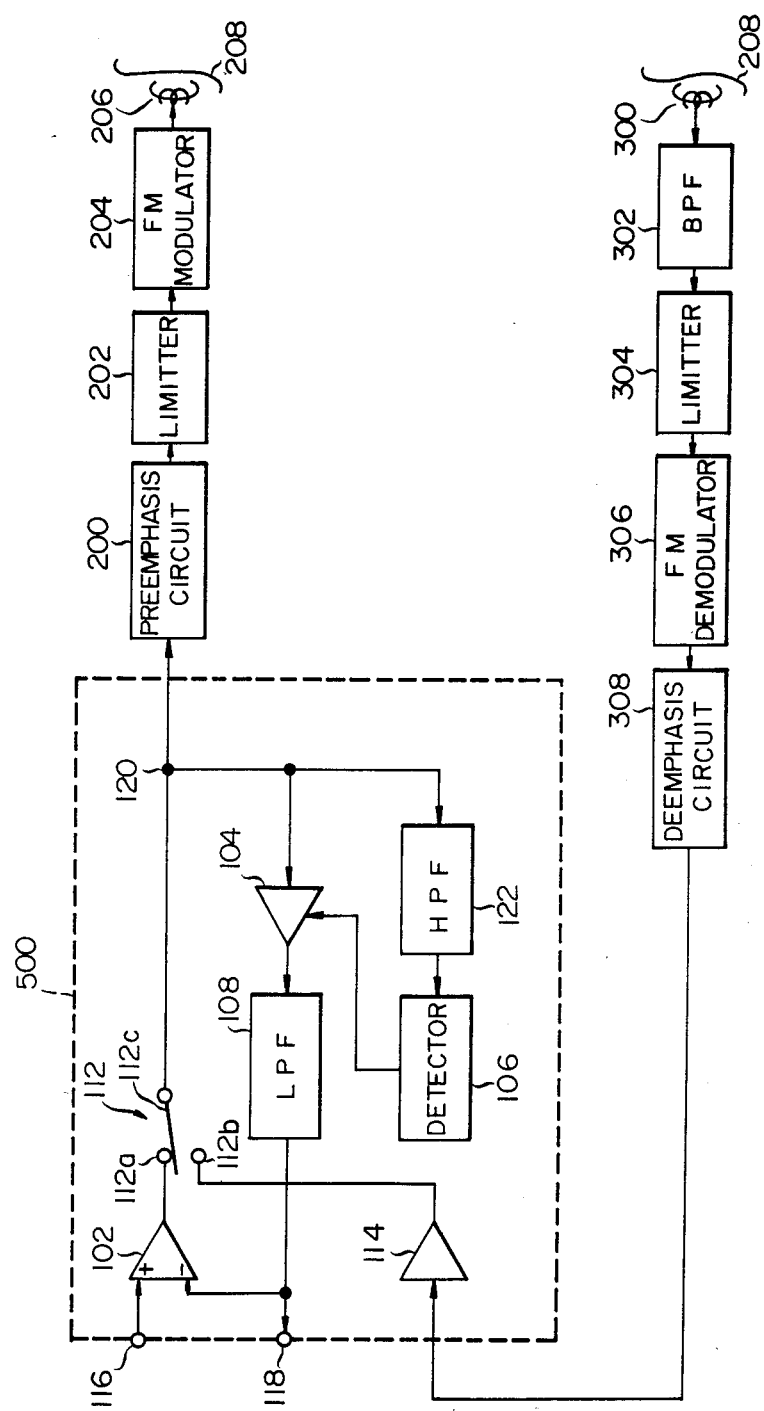
F I G. 5

NOISE REDUCTION CIRCUIT

BACKGROUND OF THE INVENTION

The present invention relates to a noise reduction circuit for use with an audio signal system of a magnetic recording and playback apparatus which records an audio signal on a recording medium with a desirable signal-to-noise (S/N) ratio and restores high frequency components of a recorded signal with fidelity while reproducing an audio signal with a minimum of noise.

Generally, an audio signal system of a magnetic recording and playback apparatus is furnished with a noise reduction circuit which includes a differential amplifier, voltage control amplifier, a high pass filter and a low pass filter. In the noise reduction circuit, noise which is attributable to the voltage control amplifier itself appears in an output of the circuit and, hence, the noise of the voltage control amplifier is the S/N ratio determining factor for the whole circuit. In a recording mode of operation, an audio signal accompanying noise attributable to the voltage control amplifier has the level of its high frequency component inclusive of the noise raised by a preemphasis circuit, which is connected to an output of the noise reduction circuit, resulting in magnification of the noise. It is difficult, therefore, to record an audio signal keeping this kind of noise down on a recording medium.

Further, there is another problem associated with a noise reduction circuit having an encoder frequency characteristic which remains flat even in a high frequency range. This brings about an excessive boost of high frequency signal components in the subsequent preemphasis circuit. In turn, the excessively boosted high frequency components are limited in the subsequent limiter and, thus, the original high frequency components are no longer restored in the playback mode of operation in the complementary manner. The result is a deteriorated audio signal out from the noise reduction circuit.

SUMMARY OF THE INVENTION

It is therefore an object of the present invention to provide a noise reduction circuit for use with an audio signal system of a magnetic recording and playback apparatus which records audio signals on a recording medium with an excellent S/N ratio, restores high frequency signal components with improved accuracy, and reproduces audio signals with a minimum of noise.

It is another object of the present invention to provide a generally improved noise reduction circuit.

In one aspect of the present invention, in a noise reduction circuit having an encoder for applying to a preemphasis circuit an audio signal to be recorded on a recording medium in a recording mode of operation by compressing the audio signal, and a decoder for expanding an audio signal reproduced from the recording medium through a deemphasis circuit in a playback mode of operation, there is provided the encoder which comprises a differential amplifier responsive to the audio signal to be recorded, a first voltage control amplifier responsive to an output of the differential amplifier, a first high pass filter responsive to the output of the differential amplifier, the first high pass filter having a filtering characteristic which raises a level of the input signal thereto in a high frequency range, a first detector responsive to an output of the first high pass filter, the first detector applying an output thereof to the first voltage control amplifier, and a first low pass filter responsive to an output of the first voltage control amplifier, the first low pass filter applying an output thereof to the differential amplifier, whereby a level of an output of the encoder is controlled relatively low in the high frequency range with respect to a level of the output thereof in the low frequency range.

The decoder comprises an amplifier responsive to the audio signal output from the deemphasis circuit, a second voltage control amplifier responsive to an output of the amplifier, a second high pass filter responsive to an output of the amplifier, the second high pass filter having a filtering characteristic which raises a level of the input signal thereto in a high frequency range, a second detector responsive to an output of the second high pass filter, the second detector applying an output thereof to the second voltage control amplifier, and a second low pass filter responsive to an output of the second voltage control amplifier.

In another aspect of the present invention, there is provided a noise reduction circuit having an encoder for applying to a preemphasis circuit an audio signal to be recorded on a recording medium in a recording mode of operation by compressing the audio signal, and a decoder for expanding an audio signal reproduced from the recording medium through a deemphasis circuit in a playback mode of operation. The noise reduction circuit comprises a differential amplifier responsive to the audio signal to be recorded, the differential amplifier applying an output thereof to the preemphasis circuit, a voltage control amplifier responsive to an output of the differential amplifier, a high pass filter responsive to an output of the differential amplifier, the high pass filter having a filtering characteristic which raises a level of the input signal thereto in a high frequency range, a detector responsive to an output of the high pass filter, the detector applying an output thereof to the voltage control amplifier, a low pass filter responsive to an output of the voltage control amplifier, the low pass filter applying an output thereof to the differential amplifier, an amplifier responsive to the audio signal to be reproduced through the deemphasis circuit, the amplifier applying an output thereof to the voltage control amplifier and the high pass filter, and a switch for selectively supplying an output of the differential amplifier and an output of the amplifier to both the voltage control amplifier and the high pass filter in a recording mode of operation and a playback mode of operation, whereby a level of an output of the encoder is controlled low in a high frequency range with respect to a level of an output thereof in the low frequency range.

In accordance with the present invention, a noise reduction circuit for use with an audio signal system of a magnetic recording and playback apparatus is provided which is equipped with an encoder for recording an audio signal on a recording medium with a desirable S/N ratio and a decoder for desirably restoring a high frequency component of a recorded signal and reproducing an audio signal with little noise. A low pass filter is provided after a voltage control amplifier so as to attenuate a noise component in a high frequency range which is attributable to the voltage control amplifier itself. A high pass filter has a filtering characteristic which makes the signal level in a high frequency range higher, compared to conventional one, thereby lowering the level of an output of the encoder in a high frequency range.

The above and other objects, features, advantages of the present invention will become apparent from the following detailed description taken with the accompanying drawings.

BRIEF DESCRIPTION OF THE DRAWINGS

FIGS. 3A-3D are graphs representative of characteristics of various portions which constitute the noise reduction circuit of FIG. 2, FIG. 3A showing a preemphasizing characteristic of an encoder, FIG. 3B a weighting characteristic of the encoder and a decoder, FIG. 3C an encoding characteristic of the encoder, and FIG. 3D a deemphasizing characteristic of the decoder;

FIG. 5 is a block diagram of an audio signal system of a magnetic recording and playback apparatus which employs another embodiment of the present invention.

DESCRIPTION OF THE PREFERRED EMBODIMENTS

While the noise reduction circuit of the present invention is susceptible of numerous physical embodiments, depending upon the environment and requirements of use, a substantial number of the herein shown and described embodiments have been made, tested and used, and all have performed in an eminently satisfactory manner.

To facilitate understanding of the present invention, a brief reference will be made to an audio signal system of a magnetic recording and playback apparatus furnished with a prior art noise reduction circuit. A prior art audio signal system shown in FIG. 1 comprises an audio frequency modulation (FM) recording system. The audio FM recording system is such that in a recording mode of operation an audio signal to be recorded is recorded on a magnetic recording medium after frequency modulation while, in a playback mode of operation, the frequency-modulated audio signal is demodulated to restore the original audio signal.

In detail, in the recording mode, an audio signal is recorded on a magnetic recording medium after being sequentially routed through a noise reduction circuit adapted to encode an input signal by compressing its level over the whole band, a preemphasis circuit for boosting a high frequency component of an output of the noise reduction circuit, a limiter for limiting the amplitude of an output of the preemphasis circuit, and an FM modulator for frequency-modulating an output of the limiter. In the playback mode, on the other hand, the FM audio signal recorded on the recording medium together with a video signal is reproduced inclusive of noise which is in turn frequency limited by way of a banpass filter adapted to pick up the audio signal only, a limiter, an FM demodulator for demodulating the FM signal output from the limiter, a deemphasis circuit for reducing a high frequency component of an output signal of the deemphasis circuit, and the noise reduction circuit for expanding the level of an input signal over the whole band.

Assume that a level compression ratio in decibel unit of 2:1 is assigned to the noise reduction circuit which performs the audio FM recording function. Then, a signal level of −60 dB will be recorded after being compressed to −30 dB and reproduced after being expanded by 30 dB. This is an improvement in the S/N ratio of a system from the original −60 dB to −90 dB (i.e. improvement by 30 dB), allowing signals recorded by such a system to be reproduced with a good S/N ratio.

Figure 1:
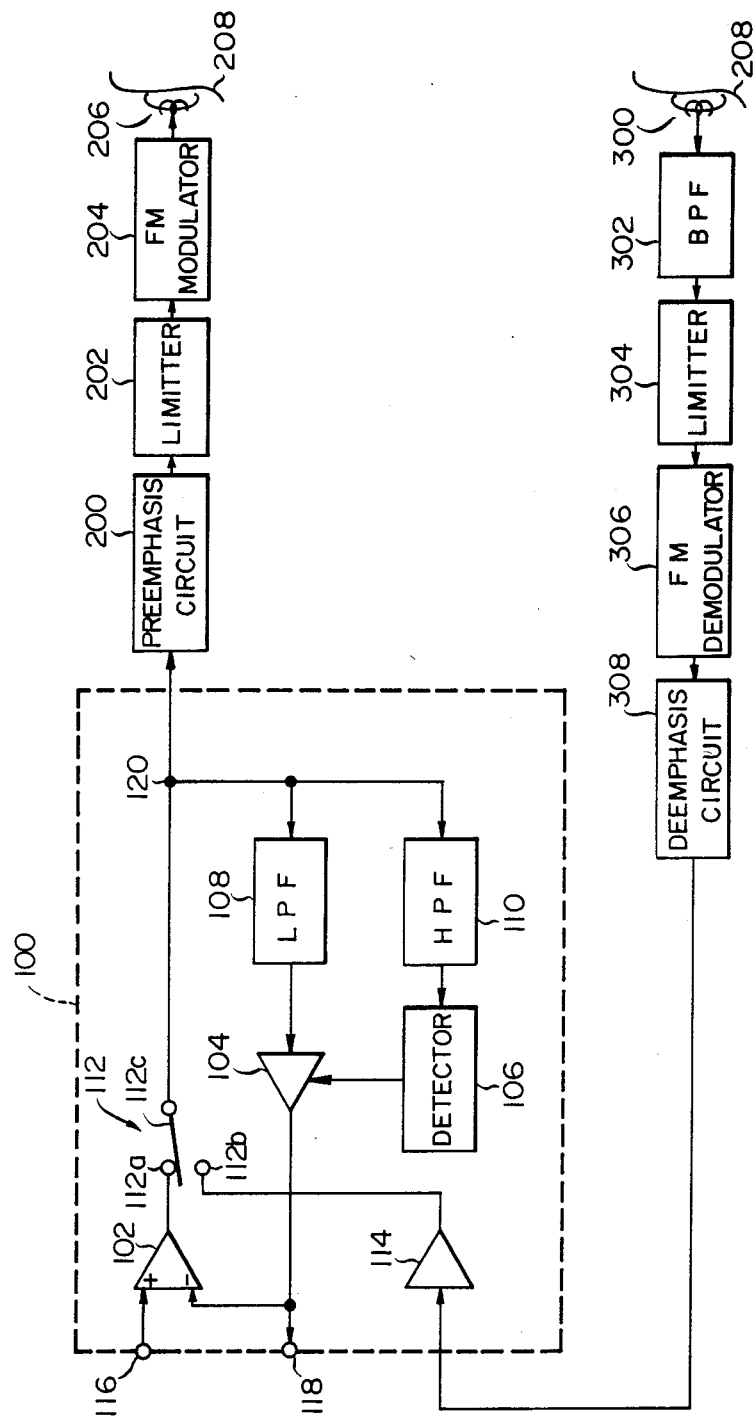
FIG. 1 is a block diagram of an audio signal system of a magnetic recording and playback apparatus which includes a prior art noise reduction circuit.

As shown in FIG. 1, the noise reduction circuit, generally 100, comprises a differential amplifier 102, a voltage control amplifier (VCA) 104, a detector 106, a low pass filter (LPF) 108, a high pass filter (HPF) 110, a switch 112 having stationary contacts 112a and 112b and a movable contact 112c, and an amplifier (AMP) 114.

The low pass filter 108 has a peculiar filtering characteristic similar to one shown in FIG. 3D, unlike a normal low pass filter having a high frequency cut-off characteristic. Likewise, the high pass filter 110 has a peculiar filtering characteristic (not shown), which is substantially complementary to the characteristic of the low pass filter 108, unlike a normal high pass filter having a low frequency cut-off characteristic. Combining such characteristics of the low pass filter 108 and high pass filter 110, the noise reduction circuit 100 attains an encoding characteristic in which the output response is flat, as indicated by phantom lines in FIG. 4B.

An audio signal to be recorded come in through an input terminal 116 while an audio signal to be reproduced goes out through an output terminal 118.

An audio signal system of a magnetic recording and playback apparatus of the type using the audio FM recording system is made up of a record system and a playback system. The record system comprises the input terminal 116, the noise reduction circuit 100, a preemphasis circuit 200, a limiter 202, an FM modulator 204, and a magnetic record head 206. The playback system, on the other hand, comprises a magnetic playback head 300, a bandpass filter (BPF) 302, a limiter 304, an FM demodulator 306, a deemphasis circuit 308, the noise reduction circuit 100 and the output terminal 118. In this manner, the noise reduction circuit 100 is shared by the record system and the playback system.

When operating for the record system, the noise reduction circuit 100 sets up the following signal paths thereinside. In this mode of operation, the movable contact 112c of the switch 112 for selecting the record system or the playback system is connected to the stationary contact 112a. The signal paths are a signal path extending from the audio signal input terminal 116 to the preemphasis circuit 200 via a non-inverting input terminal of the differential amplifier 102, an output terminal of the amplifier 102, the switch 112 (stationary contact 112a and movable contact 112c) and a junction 120, a feedback path extending from an output of the differential amplifier 102 to an inverting input terminal of the differential amplifier 102 via the switch 112 (stationary contact 112a and movable contact 112c), the junction 120, the low pass filter 108 and the VCA 104, and a control signal path extending from the output of the differential amplifier 102 to a control terminal of the VCA 104 via the switch 112 (stationary contact 112a and movable contact 112c), the junction 120, the high pass filter 110 and the detector 106. The control signal path is adapted to control (weight) the gain of the VCA 104.

Meanwhile, when operating for the playback system, the noise reduction circuit 100 sets up the following signal paths. In this mode of operation, the movable contact 112c of the switch 112 is connected to the other stationary contact 112b. The signal paths are a signal path extending from the amplifier 114 applied with an audio signal to be reproduced from the deemphasis circuit 308 to the output terminal 118 via the switch 112 (stationary contact 112b and movable contact 112c), the junction 120, the low pass filter 108 and the VCA 104, and a control signal path extending from the amplifier 114 to the VCA 104 via the switch 112 (stationary contact 112b and movable contact 112c), the junction 120, the high pass filter 110 and the detector 106. The control signal path is used for controlling (weighting) the gain of the VCA 104.

As previously discussed, the noise reduction circuit 100 constructed as described above for the recording has had some problems left unsolved. Since noise attributable to the VCA 104 itself appears in the output of the whole circuit 100 and the level of a high frequency component of the resulting signal inclusive of the noise is boosted by the preemphasis circuit 200, the resultant signal is recorded on a magnetic recording medium in the form of a tape 208 for instance by the record head 206 with the noise enhanced. Also, since the encoding frequency characteristic of the circuit 100 remains flat even in a high frequency range, the signal in the high frequency range excessively magnified by the preemphasis circuit 200 is limited by the limiter 202, resulting in poor fidelity signal reproduction as discussed before.

Reference will be made to FIGS. 2-5 for describing preferred embodiments of the noise reduction circuit in accordance with the present invention. In FIGS. 2-5, the same structural elements as those shown in FIG. 1 are designated by like reference numerals and detailed description thereof will be omitted for simplicity.

The embodiments of the present invention are distinguished from the prior art noise reduction circuit 100 shown and described by two unique features: whereas the prior art noise reduction circuit 100 has the low-pass filter 108 preceding the VCA 104, a noise reduction circuit 400 or 500 of the present invention has it succeeding the VCA 104, and, compared to the filtering characteristic of the high pass filter 110 in the prior art circuit 100, that of a high pass filter 122 in the circuit 400 or 500 has more emphasis in a high frequency range (not shown), i.e. a characteristic opposite to one shown in FIG. 3B.

Figure 2:
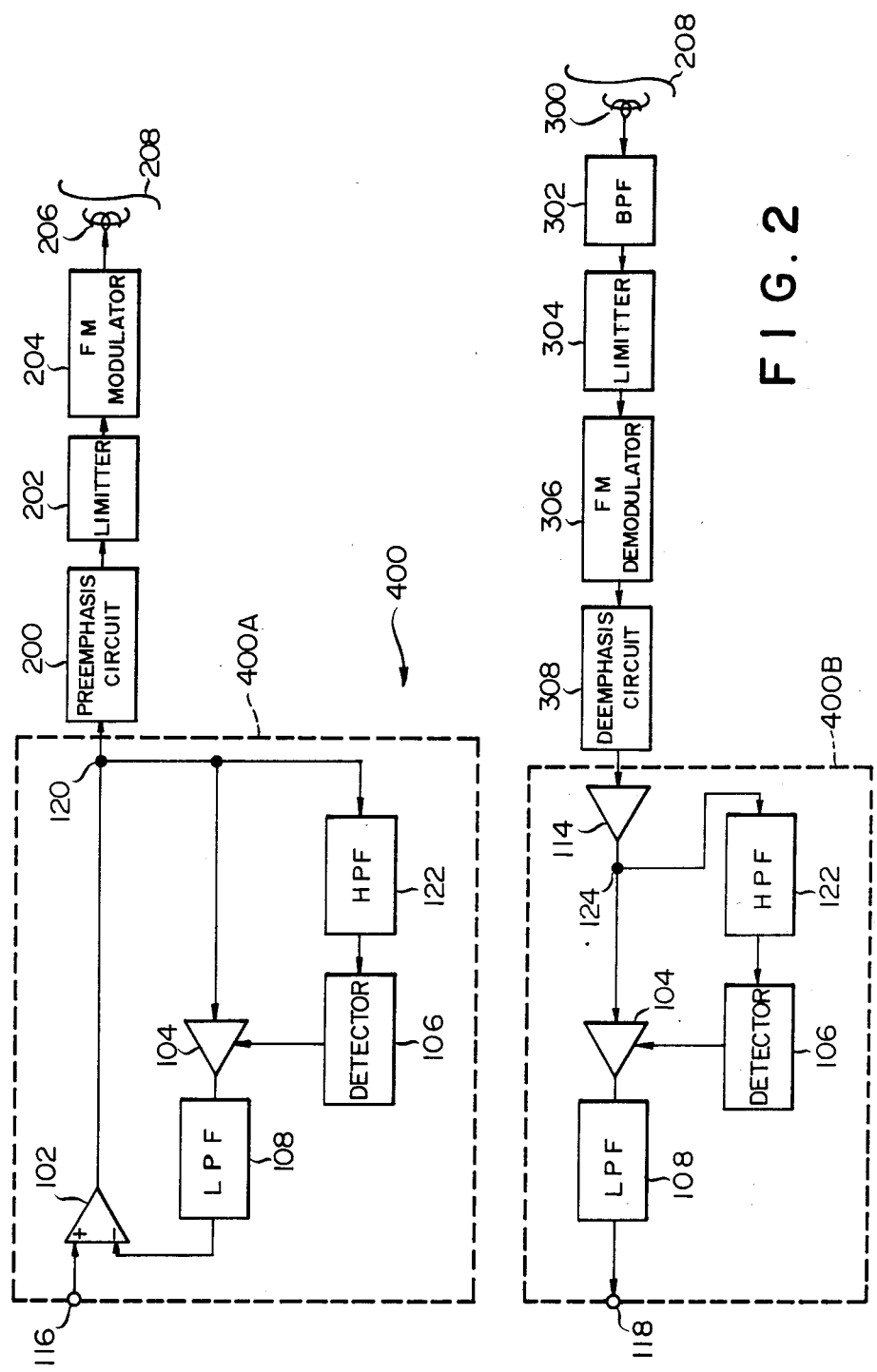
FIG. 2 is a block diagram of an audio signal system of a magnetic recording and playback apparatus which employs a noise reduction circuit embodying the present invention.

Referring to FIG. 2, the noise reduction circuit 400 in accordance with the first embodiment of the present invention is made up of an encoder 400A associated with a record system and a decoder 400B associated with a playback system. The encoder 400A has three signal paths: a first signal path extending from an input terminal 116, to which an audio signal to be recorded is applied, to a preemphasis circuit 200 via a non-inverting input (first input terminal) of a differential amplifier 102, an output terminal of the amplifier 102 and a junction 120, a feedback path extending from the output terminal of the differential amplifier 102 to an inverting input (second input terminal) of the amplifier 102 via the junction 120, a VCA 104 and a low pass filter 108, and a first control signal path extending from the output terminal of the differential amplifier 102 to a control terminal of the VCA 104 via a high pass filter 122 and a detector 106. The first control signal path is used for controlling (weighting) the gain of the VCA 104.

The decoder 400B in the playback system has two signal paths: second signal path extending from an amplifier 114, to which an audio signal to be reproduced output from a deemphasis circuit 308 is applied, to an output terminal 118 via a junction 124, a VCA 104 and a low pass filter 108, and a second control signal path extending from the amplifier 114 to a control terminal of the VCA 104 via the junction 124, a high pass filter 122 and a detector 106. The control signal path is used for controlling (weighting) the gain of the VCA 104.

The VCA 104, detector 106 and low pass filter 108 in the encoder 400A are common in function to those in the decoder 400B.

As described above, in the first embodiment, the low pass filter 108 is provided after the VCA 104 so that it attenuates any high frequency noise component which is generated in the VCA 104. Further, the high pass filter 122 included in each of the encoder 400A and decoder 400B in the illustrative embodiment has such a filtering characteristic which, compared to that of the high pass filter 110 of the prior art noise reduction circuit 100, has more emphasis in a high frequency range (not shown), i.e. a characteristic opposite to one shown in FIG. 3B. As a result, the noise reduction circuit attains an encoding characteristic indicated by solid lines in FIG. 4B, in which the output signal level of the encoder 400A becomes lower in a high frequency range.

Referring to FIGS. 3A-3D, there are shown graphs which indicate characteristics of varous portions of the noise reduction circuit 400 in accordance with the present invention, which is shown in FIG. 2. In detail, FIG. 3A shows a preemphasizing characteristic of the encoder 400A which raises the signal level in a high frequency range. FIG. 3B shows a weighting characteristic shared by the encoder 400A and the decoder 400B which greatly lowers the signal level in the high frequency range such that the signal level in the high frequency range raised in FIG. 3A is even more lowered. This characteristic is particular to a control signal which is fed from the detector 106 to the control terminal of the VCA 104 in order to control (weight) the gain of the VCA 104. FIG. 3C shows an encoding characteristic of the encoder 400A which is the difference between the characteristics shown in FIGS. 3A and 3B. Further, FIG. 3D shows a deemphasizing characteristic particular to the decoder 400B which lowers the signal level in the high frequency range complementary to the raise shown in FIG. 3A.

Figure 4A:
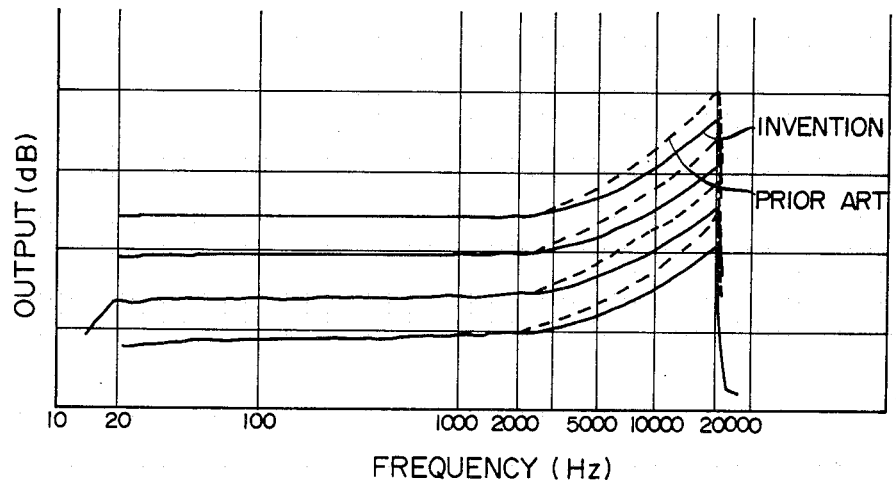
FIGS. 4A and 4B are graphs showing input and output characteristics of a preemphasis circuit which is used in combination with the embodiment shown in FIG. 2, FIG. 4A showing an output characteristic of the preemphasis circuit and FIG. 4B, an input characteristic of the same.
Figure 4B:
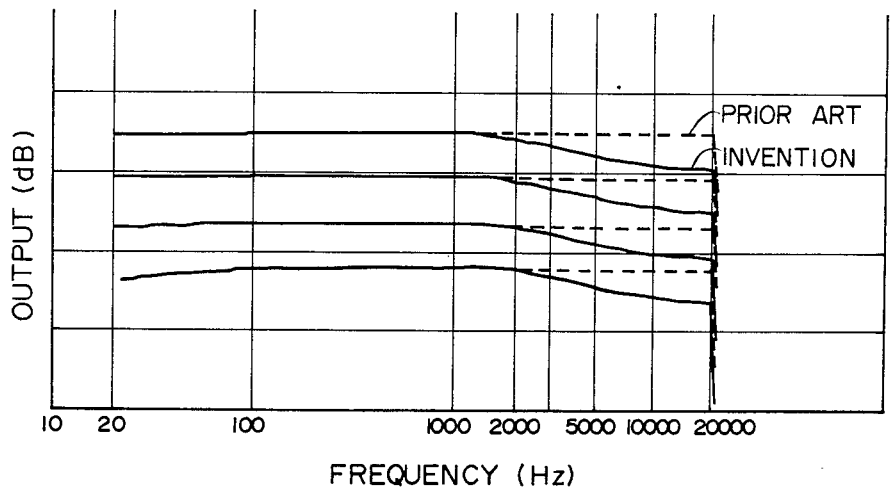

Referring to FIGS. 4A and 4B, graphs are shown which respectively represent input and output characteristics of the preemphasis circuit 200 which is used with the noise reduction circuit 400 in accordance with the first embodiment of the present invention. The four curves in each of FIGS. 4A and 4B were obtained by supplying four different levels of audio signals to be recorded to the noise reduction circuit 400.

In the graph of FIG. 4A indicative of an output characteristic of the preemphasis circuit 200, the phantom lines show a characteristic yielded by the prior art noise reduction circuit 100 while the solid lines show a characteristic resulted by the noise reduction circuit 400 of the present invention. It will be seen that the characteristic of the present invention represented by the solid lines is lower is signal level than that of the prior art represented by the phantom lines, over the frequency range of 2000-20,000 Hz.

In the graph of FIG. 4B indicative of an input characteristic of the preemphasis circuit 200, the phantom lines show a characteristic provided by the prior art noise reduction circuit 100 while the solid lines show a characteristic resulted by the noise reduction circuit 400 of the present invention. As shown, the signal level in accordance with the present invention is lower than that of the prior art in the frequency range of 2000-20,000 Hz.

Referring to FIG. 5, an audio signal system of a magnetic recording and playback apparatus using a noise reduction circuit 500, a second embodiment of the present invention, is shown in a block diagram. In the noise reduction circuit 500, a record system and a playback system share the weighting circuit made up of the VCA 104 and detector 106 and the low pass filter 108 by switching the circuit with a switch 112 in the same manner as shown FIG. 1. The operation of the circuit 500 is essentially similar to that of the circuit 400 shown in FIG. 2 and, therefore, it will no be described any further.

In summary, it will be seen that the present invention is successful to enhance the S/N ratio of a noise reduction circuit to thereby record audio signals desirably and reproduce them with high accuracy in a high frequency range and with a minimum of noise. Specifically, advantages of the present invention are as follows:

(1) A low pass filter provided after a VCA in a noise reduction circuit serves both the frequency dependent expansion or compression for the circuit and suppressing noise attributable to the VCA simultaneously. This improves the S/N ratio of the noise reduction circuit;

(2) Even if use is made of an inexpensive VCA whose inherent noise level is relatively high, the noise reduction circuit achieves a favorable S/N ratio;

(3) In a system which records a signal by preemphasizing a high frequency component for frequency modulation of the signal, a level clipping circuit or a limiter adapted for prevention of over-modulation would not overrespond to a high frequency component of the input signal causing an inaccurate signal reproduction; and (4) When the high frequency component of a signal is expanded in the play back system, a noise component is inevitably expanded. Nevertheless, since the noise component is much lower in level than the signal components, the signal masks the noise and such a masking effect confines the noise component in a neglibile order.

Various modifications will become possible for those skilled in the art after receiving the teachings of the present disclosure without departing from the scope thereof.

What is claimed is:

1. In a noise reduction circuit having an encoder for applying to a preemphasis circuit an audio signal to be recorded on a recording medium in a recording mode of operation by compressing the audio signal, and a decoder for expanding an audio signal reproduced from the recording medium through a deemphasis circuit in a playback mode of operation, said encoder comprising:
    (a) a differential amplifier responsive to the audio signal to be recorded;
    (b) a first voltage control amplifier responsive to an output of said differential amplifier;
    (c) a first high pass filter responsive to the output of said differential amplifier, said first high pass filter having a filtering characteristic which raises a level of the input signal thereto in a high frequency range;
    (d) a first detector responsive to an output of said first high pass filter, said first detector applying an output thereof to the first voltage control amplifier; and
    (e) a first low pass filter responsive to an output of the first voltage control amplifier, said first low pass filter applying an output thereof to the differential amplifier;
    whereby a level of an output of the encoder is controlled relatively low in the high frequency range with respect to a level of the output thereof in the low frequency range.

2. A noise reduction circuit as claimed in claim 1, in which the decoder comprises
    (f) an amplifier responsive to the audio signal output from the deemphasis cirucit;
    (g) a second voltage control amplifier responsive to an output of said amplifier;
    (h) a second high pass filter responsive to an output of the amplifier, said second high pass filter having a filtering characteristic which raises a level of the input signal thereto in a high frequency range;
    (i) a second detector responsive to an output of the second high pass filter, said second detector applying an output thereof to the second voltage control amplifier; and
    (j) a second low pass filter responsive to an output of the second voltage control amplifier.

3. A noise reduction circuit as claimed in claim 2, in which an input of the differential amplifier is connected to an input terminal to which the audio signal is applied, an output of the second low pass filter being connected to an output terminal.

4. A noise reduction circuit having an encoder for applying to a preemphasis circuit an autio signal to be recoded on a recording medium in a recording mode of operation by compressing the audio signal, and a decoder for expanding an audio signal reproduced from the recording medium through a deemphasis circuit in a playback mode of operation, said noise reduction circuit comprising:
    (a) a differential amplifier responsive to the audio signal to be recorded, said differential amplifier applying an output thereof to the preemphasis circuit;
    (b) a voltage control amplifier responsive to an output of said differential amplifier;
    (c) a high pass filter responsive to an output of said differential amplifier, said high pass filter having a filtering characteristic which raises a level of the input signal thereto in a high frequency range;
    (d) a detector responsive to an output of the high pass filter, said detector applying an output thereof to the voltage control amplifier;
    (e) a low pass filter responsive to an output of the voltage control amplifier, said low pass filter applying an output thereof to the differential amplifier;
    (f) an amplifier responsive to the audio signal to be reproduced through the deemphasis circuit, said amplifier applying an output thereof to the voltage control amplifier and the high pass filter; and (g) a switch for selectively supplying an output of the differential amplifier and an output of the amplifier to both the voltage control amplifier and the high pass filter in a recording mode of operation and a playback mode of operation;

whereby a level of an output of the encoder is controlled relatively low in a high frequency range with respect to a level of the output thereof in the low frequency range.

5. A noise reduction circuit as claimed in claim 4, further comprising an input terminal connected to an input of the differential amplifier and responsive to the audio signal, and an output terminal connected to an output of the low pass filter.

* * * * *